US 12,135,349 B2

(12) United States Patent
Thurmaier

(10) Patent No.: US 12,135,349 B2
(45) Date of Patent: Nov. 5, 2024

(54) DOCKING DEVICE AND METHOD FOR COUPLING SECOND DEVICES FOR INTERFACE UNITS, DISPOSITION SYSTEM AND DOCKING ELEMENT

(71) Applicant: Turbodynamics GmbH, Stephanskirchen (DE)

(72) Inventor: Stefan Thurmaier, Bad Aibling (DE)

(73) Assignee: Turbodynamics GmbH, Stephanskirchen (DE)

( * ) Notice: Subject to any disclaimer, the term of this patent is extended or adjusted under 35 U.S.C. 154(b) by 13 days.

(21) Appl. No.: 17/830,779

(22) Filed: Jun. 2, 2022

(65) Prior Publication Data
US 2022/0390508 A1    Dec. 8, 2022

(30) Foreign Application Priority Data
Jun. 7, 2021   (DE) .................... 10 2021 114 564.3

(51) Int. Cl.
*G01R 31/28*    (2006.01)
*G01R 31/26*    (2020.01)

(52) U.S. Cl.
CPC ..... *G01R 31/2887* (2013.01); *G01R 31/2601* (2013.01)

(58) Field of Classification Search
CPC ............... G01R 31/28; G01R 31/2808; G01R 31/2867; G01R 31/2891; G01R 31/2893; H01L 21/67271; H01L 21/68; H01L 21/681
USPC ..................................... 324/750.16
See application file for complete search history.

(56) References Cited

U.S. PATENT DOCUMENTS

| | | | |
|---|---|---|---|
| 6,870,362 B2 | 3/2005 | Thurmaeier | |
| 7,382,145 B2 | 6/2008 | Thurmaeier | |
| 2006/0210382 A1* | 9/2006 | Mountz | B60D 1/465 414/498 |
| 2007/0030018 A1* | 2/2007 | Thurmaier | G01R 31/2887 324/756.04 |
| 2016/0180999 A1* | 6/2016 | Rattner | H01F 7/06 307/104 |

(Continued)

FOREIGN PATENT DOCUMENTS

| | | |
|---|---|---|
| DE | 102 16 003 A1 | 11/2003 |
| DE | 10 2004 031 426 A1 | 1/2006 |

(Continued)

OTHER PUBLICATIONS

German Search Report, dated Feb. 15, 2022, from DE 10 2021 114 564.3, filed on Jun. 7, 2021. 2 pages.

*Primary Examiner* — Alexander Satanovsky
*Assistant Examiner* — Courtney G McDonnough
(74) *Attorney, Agent, or Firm* — HoustonHogle LLP

(57) ABSTRACT

A docking device for coupling a test device (31) or storage device (30) (first device) for interface units (33) for testing electronic components to at least one handling unit (32) for handling and/or transporting interface units (33) (second device), has a first docking element (1) and a second docking element (2), the first docking element (1) being movable relative to the second docking element (2) and being fixable in an end position. A sensor arrangement is provided for detecting the end position of the first docking element (1) relative to the second docking element (2) on the side of the first device and/or on the side of the second device.

32 Claims, 3 Drawing Sheets

(56) References Cited

U.S. PATENT DOCUMENTS

2016/0202292 A1* 7/2016 West .................. G01R 1/067
                                                324/750.25

FOREIGN PATENT DOCUMENTS

| DE | 10 2005 036 808 A1 | 2/2007 |
| DE | 10 2019 119 134 A1 | 1/2021 |
| DE | 10 2020 104 641 A1 | 8/2021 |
| WO | WO 2013/164407 A1 | 11/2013 |
| WO | WO 2015/025024 A2 | 2/2015 |

* cited by examiner

DOCKING DEVICE AND METHOD FOR COUPLING SECOND DEVICES FOR INTERFACE UNITS, DISPOSITION SYSTEM AND DOCKING ELEMENT

RELATED APPLICATIONS

This application claims priority to German Application No. 10 2021 114 564.3, filed on Jun. 7, 2021, which is incorporated herein by reference in its entirety.

FIELD AND BACKGROUND OF THE INVENTION

The present invention relates to a docking device and a method for coupling a test device or storage device to a handling unit for interface units, a disposition system for managing interface units, and a docking element.

The present invention is in the field of test devices for testing semiconductor elements. Such test devices for testing semiconductor elements usually comprise a test unit or a test head (also denoted as "tester") and a feeding machine (also denoted as "handler" or "prober"). By means of such test devices, electronic components, such as integrated circuits or wafers, can be tested for their functionality. Such a test device comprises an interface unit, which is usually formed by an adapter board (also called "board" or "load board" or "device interface board" (DIB)) arranged in a stiffener frame (also called "stiffener"). The adapter board has a plurality of contact elements arranged specifically for a particular type of semiconductor element with which the semiconductor elements under test are contacted.

The interface unit is arranged in the area of the interface between the test unit and the feeding device. The contact elements are each arranged in a pattern specific to the semiconductor elements to be tested in order to be able to contact the contacting points of the semiconductor elements correctly. The interface unit is detachably attached to either the test unit or the feeding device, depending on the test device, so that the interface unit is interchange-able to allow different semiconductor devices to be tested. Interface units of various designs are known in the art. The interface units are also referred to as test boards.

Such interface units are manufactured individually. They comprise a large number of contacting points in a very small available space. These interface units are therefore extremely expensive and also very sensitive. In a test center, there are often several tens to several thousands of interface units for one test device. In order to be able to test different types of semiconductor elements with one test device, the interface unit must be exchanged, each of which is designed for a specific type of semiconductor element. The interface units adapt the universally applicable test devices to the respective individual requirements of the semiconductor elements for the test application.

WO 2015/025024 A2 shows a handling unit for handling such an interface unit. This handling unit is a mobile trolley, which has elements for receiving an interface unit. The handling unit has bushing-like alignment elements and pin-like centering elements for coupling the handling unit to the test device in a positionally accurate manner. This ensures that the handling unit is correctly positioned with respect to the test device in order to pick up an interface unit or insert it on the test device. This prevents damage when transferring the interface unit from the handling unit to the test device in reverse. The handling unit can be used to move the interface unit in order, for example, to place it on an inspection table for inspection of the interface unit. The alignment elements and centering elements can be pulled together by means of a bayonet-type locking device having a latching lug and a latching recess, wherein the pulling together and locking can be accomplished by rotating the pulling element by means of a handle in such a way that the latching lug pulls into the latching recess.

From U.S. Pat. No. 6,870,362 B2 a docking device for coupling a first device consisting of a handler or prober and a second device consisting of a test head for electronic components is known, wherein at least one locking unit is provided which has an axial insertion opening for inserting a locking pin. In the region of the insertion opening, a plurality of balls are arranged between which the locking pin can be inserted. A ball clamping sleeve is also provided, which effects a radial movement of the balls inwards by means of axial displacement, so that the balls engage in a circumferential groove of the locking pin and can thus fix the latter. The axial displacement can be triggered by a rotatable threaded sleeve, the internal thread of which meshes with an external thread of the ball clamping sleeve, which is mounted so as to be non-rotatable but axially displaceable. The rotation of the threaded sleeve can be controlled by a wire rope hoist.

In U.S. Pat. No. 7,382,145 B2, the above-mentioned docking device is further developed in that the axial displacement of the ball clamping sleeve can be triggered and controlled via a pressure medium. The ball clamping sleeve can thereby be reset without pressure by at least one spring. With a docking device of the type mentioned, a particularly simple, easy and precise coupling of the handler or prober with the test head weighing up to 1000 kg is made possible.

In the subsequently published DE 10 2020 104 641.3, a storage device for storing a plurality of interface units is described, the storage device having a plurality of compartments for receiving a carrier, respectively, and one such carrier being designed to receive an interface unit, respectively. A transfer area having a transfer platform, which is formed as a drawer such that it can be slid into the inner area of the storage device so that an interface unit can be slid between the transfer area and the inner area of the storage device, is provided at the edge area of the storage device. Adjacent to the transfer area, at least one alignment element is provided for positionally coupling a handling device for handling an interface unit so that a handling device coupled thereto can exchange an interface unit with the transfer platform. This application also describes a disposition system for automatically managing interface units, comprising at least one storage device with a plurality of carriers, an automatically movable handling device, at least one test device and a central control device, which is designed such that interface units can be automatically transported back and forth between the test device and the storage device by means of the handling device and can be automatically exchanged between the handling device and the storage device.

SUMMARY OF THE INVENTION

The present invention is directed to providing a docking device, a docking element, a disposition system, and a method for coupling an interface unit handling device to an interface unit storage device or test device, which enable automated handling of a plurality of interface units and allow them to be exchanged between the storage unit and a test system without damage.

The problem is solved by the subject matters of the independent claims. Advantageous embodiments are given with the respective dependent claims.

According to one aspect of the present invention, there is provided a docking device for coupling a first device comprising a test device or a storage device for interface units for testing electronic components to at least one second device comprising a handling unit for handling and/or transporting interface units, which is adapted to exchange an interface unit with the first device in a coupled state, wherein the docking device comprises a first docking element being attached to one of the first device and the second device and a second docking element being attached to the other of the first device and the second device, the first docking element being movable relative to the second docking element and fixable in an end position, wherein a sensor arrangement is provided which is adapted and arranged to detect the end position of the first docking element relative to the second docking element on the side of the first device and/or on the side of the second device.

A sensor technology that senses when an end position of the locking pin is reached on the equipment side and reports this to the equipment control system can enable further automation of the entire equipment in that, depending on the sensed state, operations on the test device or storage device side, for example, such as placing or removing or otherwise moving an interface unit at a transfer station, or on the handling unit side, such as locking or unlocking or taking over or transferring an interface unit, can be triggered, prepared, released or blocked, or other relevant or necessary automatic handling steps can be performed. Detection by means of an end position sensor can also increase the degree of automation of the entire test cell. Thus, even more devices can be integrated that are used in the test cell. Automated handling of a plurality of interface units can also be enabled so that they can be exchanged between a storage unit and a test system without damage. A plurality of handling units can be used selectively, and assignment of an interface unit to a handling unit, a storage device, or a test device or other device is possible at any time. By sensing the end position on both sides, it is also possible to operate the handling device autonomously.

The sensor arrangement may include a first sensor device adapted and arranged to detect the end position of the first docking element relative to the second docking element on the side of the first device. The first sensor device may enable detection of the presence of the handling device and resulting signal generation for the storage device or test device or further test cells to initiate relevant and necessary automatic handling steps.

The sensor arrangement may, alternatively or in addition to the first sensor device, comprise a second sensor device which is adapted and arranged to detect the end position of the first docking element relative to the second docking element on the side of the second device. The second sensor device can be used to detect the end position of the handling device, which is equivalent to reaching the safe transfer position for the interface unit, and resulting signal generation to enable the transfer. Depending on the number of docking devices, signals can be generated in the corresponding number and evaluated via an AND link.

The second sensor device can be used to detect and signal the reaching of an end position of the first docking element relative to the second docking element on the side of the second device. This makes it possible to enable or block operations of the handling unit on the side of the second device consisting of the handling unit, such as gripping or releasing, securing or loosening, retracting or extending a transfer device or otherwise moving an interface unit on the handling unit, independently of sensing operations on the equipment side, i.e. the side of the first device. This can further improve the automation of an equipment for testing electronic components using a plurality of interface units.

The first sensor device may comprise a sensor element, in particular Hall element, arranged on the second docking element, and a trigger element, in particular magnetic element, arranged on the first docking element or arranged on the second docking element such that it is actuatable by contact with the first docking element, wherein the sensor element is adapted to interact with the trigger element to detect the end position of the first docking element relative to the second docking element. A magnetic element may be any element that is fully or partially magnetic or magnetizable. A Hall element can be used to provide reliable and accurate sensing. Hall elements and magnetic elements can be accommodated in a confined space with a high degree of integration, and the sensing itself is contactless and thus wear-free.

The second sensor device may comprise a sensor element, in particular Hall element, arranged on the first docking element, and a trigger element, in particular magnetic element, arranged on the first docking element and actuatable by contact with the second docking element, wherein the sensor element is adapted to interact with the trigger element to detect the end position of the first docking element relative to the second docking element. Since the trigger element of the second sensor device is arranged on the first docking element, no adaptations are required on the equipment side, i.e. the side of the second device with the second docking element. The same advantages as described above apply to magnetic and Hall elements.

The trigger element of the second sensor device may have an annular actuating member movably and resettably mounted on the first docking element to be movable with respect to the sensor element of the second sensor device fixedly mounted on the first docking element. Annular, in the sense of the invention, can be any shape formed and arranged surrounding an axis. By means of an annular actuating member, a symmetrical introduction of force can be ensured, which can enable safe triggering and prevent canting.

The first sensor device and/or the second sensor device can be designed to signal a detection of the end position to an electronic control unit and/or the first sensor device can be designed to signal a detection of the end position to the second device and/or the second sensor device can be designed to signal a detection of the end position to the first device. By signaling to an electronic control unit, operations at the first and/or second device can be controlled centrally. By signaling on the side of one device to the respective other device, operations at the devices can also be controlled locally. A degree of automation and also autonomous control can be improved up to swarm intelligence-like concepts. The signaling can be provided wired via plug connections or hardwired connections or wireless. Depending on the requirements, any suitable concept can be used for signaling, such as via LAN, WLAN, mobile communications, short-range communication (Bluetooth etc.), optical signaling (infrared, laser, fiber optics etc.), RFID, acoustic signaling (ultrasound etc.), any suitable interface and any suitable standard.

The first docking element may have a locking pin and the second docking element may have a locking unit, the locking unit having an axial insertion opening for inserting the locking pin and a retaining mechanism for retaining the locking pin in the end position of the first docking element relative to the second docking element to fix the first docking element relative to the second docking element in the end position. In this manner, the first docking element can act as a centering unit that centers against the second docking element, and the second docking element can act as an alignment unit against which the first docking element aligns.

In this regard, the locking pin or a housing of the first docking element may have a abutment surface and the locking unit or a housing of the second docking element may have a mating surface corresponding to the abutment surface, wherein an abutment of the abutment surface against the mating surface defines the end position of the first docking element relative to the second docking element, wherein preferably the abutment surface and the mating surface are circumferential conical surfaces. The abutment surface and the mating surface can stably assume the end position, and can also stably and uniquely define the position of the first device relative to the second device.

Furthermore, the locking unit may comprise a plurality of balls formed in the region of the insertion opening, between which the locking pin is insertable, and a ball clamping sleeve displaceable in the axial direction, which in a first position allows a radial position of the balls outside the insertion region of the locking pin, in which the locking pin can be inserted between the balls, and in a second position locks the balls in a locking position in which the balls protrude into a circumferential groove of the inserted locking pin, the position of the ball clamping sleeve preferably being actuated by a pressure means. A pressure means can act in particular pneumatically or hydraulically. However, electromagnetic actuation is also conceivable. Such a locking unit can provide fast, accurate and stable locking, it is simple and easy to actuate and can operate in an automated manner. It can be manufactured in a simple and cost-effective manner with few and, in particular, low-wear parts.

If the trigger element of the first sensor device is a magnetic element arranged at or within a tip of the locking pin of the first docking element, this makes interaction with a Hall element arranged in the locking unit particularly simple and reliable. If, in addition, the magnetic element is adjustable in its distance from an end cross-section of the tip of the locking pin, the release position or the end position can be precisely adjusted or readjusted. The adjustment can be made possible, for example, by screwing in or out by means of a screw thread.

The annular actuating member can be arranged in an annular space surrounding the locking pin and set back from a tip of the locking pin. In this way, damage and incorrect actuation can be avoided.

The second docking element may include axis alignment means for aligning an axis of the first docking element with respect to an axis of the second docking element, the axis alignment means including at least one of a lead-in bevel for axial and radial capturing, a guide surface or guide edge for axial guidance, and a taper seat surface for centering in the end position.

According to a second aspect of the present invention, there is provided a docking device for coupling a first device consisting of a test device or a storage device for interface units for testing electronic components to at least one second device consisting of a handling unit for handling and/or transporting interface units, which is adapted to exchange an interface unit with the first device in a coupled state, wherein the docking device comprises a first docking element, being attached to one of the first device and the second device and a second docking element being attached to the other of the first device and the second device, wherein the first docking element is movable relative to the second docking element and fixable in an end position, and wherein a third sensor device is provided which is adapted and arranged to detect an approach position of the first docking element relative to the second docking element before the end position preferably on the side of the first device. The docking device may be otherwise configured as in the aspect previously described.

The third sensor device can be used to detect and signal an approach position before the first docking element reaches an end position relative to the second docking element. This is preferably done on the side of the first device that is associated with an equipment side. This makes it possible to trigger, prepare or complete operations on the equipment side, such as making an interlocking unit ready for operation or providing a transfer unit with or without an interface unit. The third sensor device may be configured for signaling a detection of the end position to an electronic control unit and/or to the second device. By signaling to an electronic control unit, operations at the first and/or second device can be centrally controlled. Advantages and details of the signaling can correspond to those of the first and second sensor device.

Certain operations, such as the transfer of an interface unit, can only be enabled when the end position on the side of the first device and/or the second device is reached, since this requires the devices to be positioned precisely relative to one another and otherwise there is a risk of damage to the interface units. Preparatory operations can, however, be initiated and, if necessary, completed as soon as the devices approach each other. For example, an on signal of the proximity sensor can be used to terminate processing operations on the side of the first device or to postpone an approach and locking of the docking elements until such processing operations have been terminated. Also, an off signal from the proximity sensor, i.e., a leaving of the approach position, can be used for control operations, such as an automatic and final removal of the second device from the first device, the resetting of a locking unit to a standby position, the further use of a feeding unit on the side of the first device, or the further use of the interface unit itself. This can further improve the automation of a system for testing electronic devices using a plurality of interface units.

The approach position may be a position in which an axis of the first docking element is aligned or pre-aligned relative to an axis of the second docking element.

The approach position can also be a position in which a locking unit can grip a locking element, in particular a locking pin, of the first docking element to fix the first docking element relative to the second docking element in the end position.

The docking device may comprise a first docking unit and a second docking unit, wherein the first docking unit comprises two or more first docking elements and the second docking unit comprises two or more second docking elements, or wherein the first docking unit and the second docking unit each comprise at least one first docking element and at least one second docking element. In other words, the docking device may comprise more than one pair of a first docking element and a second docking element, wherein the docking elements attached to one of the first device and the second device form the first docking unit and the docking elements attached to the other of the first device and the second device form the second docking unit. In this regard, it is generally possible for each docking unit to have identical (i.e., only first or only second) or different (i.e., both first and second) docking elements. In this regard, at least two pairs whose axes are spaced apart are advantageous to better absorb a momentum of motion in a first plane, for example in a horizontal plane. A third pair, whose axes are spaced from the first plane, may serve to also better absorb momentum of motion in a second plane, such as a vertical plane orthogonal to the first plane. Additional pairs can serve as additional safety or to increase the coupling force.

According to another aspect of the present invention, a method for coupling a first device consisting of a test device or a storage device for interface units for testing electronic components to at least one second device consisting of a handling unit for handling and/or transporting interface units, which is adapted to exchange an interface unit with the first device in a coupled state, wherein at least one first docking element, attached to one of the first device and the second device and at least one second docking element attached to the other of the first device and the second device are coupled to each other by positioning the first docking element opposite the second docking element and fixing it in an end position, wherein the end position of the first docking element relative to the second docking element on the side of the first device and/or on the side of the second device is detected. The effect and advantages of this method correspond to those of the first aspect.

In particular, an operation concerning an interface unit on the side of the first device can only be released when the end position of all first docking elements with respect to all respective second docking elements on the side of the first device has been detected, and/or an operation concerning an interface unit on the side of the second device can only be released when the end position of all first docking elements with respect to all respective second docking elements on the side of the second device has been detected.

According to another aspect of the present invention, a method for coupling a first device consisting of a test device or a storage device for interface units for testing electronic components to at least one second device consisting of a handling unit for handling and/or transporting interface units, which is adapted to exchange an interface unit with the first device in a coupled state, wherein a first docking element, attached to one of the first device and the second device and a second docking element attached to the other of the first device and the second device are coupled to each other by positioning the first docking element opposite the second docking element and fixing it at an end position, and wherein an approach position of the first docking element opposite the second docking element is sensed before the end position on the side of the first device. The effect and advantages of this method correspond to those of the second aspect. The method may comprise the steps of the previous aspect.

In particular, an operation concerning the fixing of the at least one first docking element with respect to the at least one second docking element can be enabled only after the approach position of all first docking elements with respect to all respective second docking elements has been detected.

It can be provided in each case that sensor signals on the side of the first device and/or the second device are processed autonomously or semi-autonomously and operations are executed autonomously or semi-autonomously as a function of sensor signals on the side of the first device and/or the second device.

According to another aspect of the present invention, there is provided a disposition system for automatically managing interface units, comprising:
  at least one first device which is a storage device for storing a plurality of electronic component interface units and/or a test device such as a tester or prober for testing the electronic components, and
  at least one second device, which is an independently movable handling unit with means for receiving an interface unit,
wherein the second device is couplable to the first device by means of a docking device, the docking device being configured as previously described.

The first devices and/or the second devices may be configured to autonomously or semi-autonomously process sensor signals relating to a sensing of an end position of the first docking element relative to the second docking element and/or an approach position of the first docking element relative to the second docking element, and to autonomously or semi-autonomously execute operations depending on such sensor signals.

Furthermore, a central control device may be provided, which is configured to perform a control in such a way that interface units can be automatically transported back and forth between several first devices by means of the second device and automatically exchanged between the second device and a respective first device. In this context, the control device can preferably be configured to receive and process sensor signals relating to a sensing of an end position of the first docking element with respect to the second docking element and/or an approach position of the first docking element with respect to the second docking element, and to control operations on the side of the first device and/or the second device automatically or semi-automatically depending on such sensor signals. The plurality of first devices may include one or more storage devices and/or one or more test devices.

The autonomous or semi-autonomous as well as the centralized automatic or semi-automatic control may in particular comprise performing the method according to any of the preceding aspects.

This enables the interface units to be exchanged and deposited fully automatically. The risk of damage to the interface units is reduced to a minimum.

According to another aspect of the present invention, a docking element is provided for coupling a first device consisting of a test device or a storage device for interface units for testing electronic components to at least one second device consisting of a handling unit for handling and/or transporting interface units, which is adapted to exchange an interface unit with the first device in a coupled state, by interacting with a second docking element, attached to the other of the first device and the second device, the docking element being movable relative to the second docking element and fixable in an end position, the docking element comprising a housing and a locking pin having a circumferential groove and being couplable to a locking unit of the second docking element, the docking element comprising a sensor device adapted and arranged to detect the end position of the first docking element relative to the second docking element. The effects and advantage correspond to those that can be achieved in the first aspect by the first docking element.

The sensor device may comprise a sensor element, in particular a Hall element, arranged on the first docking element, in particular within the housing thereof, and a trigger element, in particular a magnet element, arranged on the first docking element so as to be movable with respect to its position relative to the sensor element.

The trigger element may comprise an annular actuating member axially displaceably and non-rotatably and resiliently mounted on the docking element, in particular within the housing thereof, to be movable with respect to the sensor element, the annular actuating member being mounted in particular within an annular space of the housing surrounding the locking pin, the annular space preferably being radially bounded by an annular wall and a contour surface and being axially open towards the locking pin. The annular actuating member, which is mounted around the locking pin, is advantageous to provide a symmetrical actuating force so that off-center forces are avoided. A non-rotational bearing can be accomplished by the contoured surface. The non-rotational bearing can avoid torsion and inaccuracy caused by rotation of the magnetic element. If an outer wall of the annular space protrudes axially beyond the actuating member and has recesses which recede axially behind the actuating member, on the one hand the actuating member can be protected even better from unintentional actuation and actuation can be ensured by in the same arrangement as the recesses on the second docking element.

The trigger element can be adjustable in its distance from the sensor element, in particular by screwing in or out by means of a screw thread in a post coupled to an actuating member, in particular the annular actuating member. This allows the trigger point of the sensor device to be finely adjusted and adapted.

The locking pin may carry a further trigger element, in particular magnetic element, which is adapted to interact with a sensor device on the side of the second docking element and which is preferably adjustable in its distance from an end cross section of the tip of the locking pin, in particular by screwing in or out by means of a screw thread.

The locking pin may comprise a sleeve which is connected to the housing via a saddle and which has the circumferential groove. This allows the geometry of the docking element to be changed in a simple and inexpensive manner without changing the housing and other components. In addition, when the circumferential groove wears out, the sleeve can be replaced easily and inexpensively.

The housing may have a cylindrical or substantially cylindrical main body and a tapered or substantially tapered bevel toward the locking pin. This facilitates centering and alignment on the second docking element.

The sensor element can be designed to signal a detection of the end position to an electronic control unit. This can be arranged on the side of the sensor element, on the side of the second sensor element, or in a central instance, such as an overall equipment control system.

BRIEF DESCRIPTION OF THE DRAWINGS

The invention is explained in more detail below by way of example with reference to the drawings. The drawings show in.

DETAILED DESCRIPTION OF THE PREFERRED EMBODIMENTS

Figure 1:
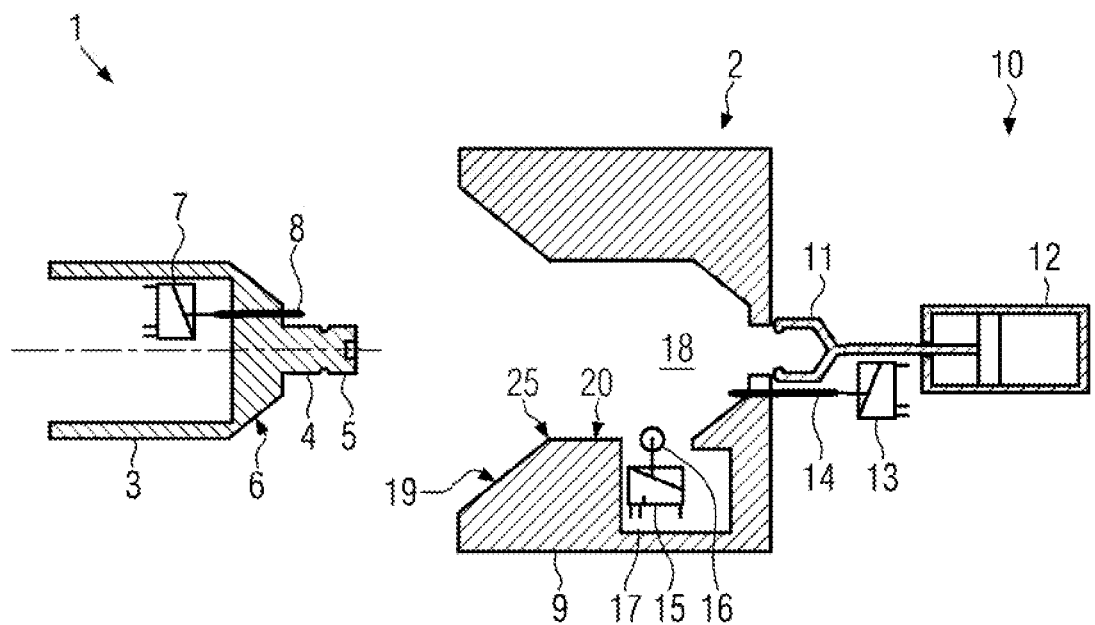
FIG. 1 a docking device with two docking elements in an axial cut-away view in a state of an approach, FIG. 2 the docking device of FIG. 1 in a pre-centered state, FIG. 3 a disposition system with a storage device, a handling unit, a test device and a central control device in a schematic perspective view, FIG. 4 a docking element configured as a centering unit in a perspective view, FIG. 5 the docking element of FIG. 4 in a longitudinal sectional view.

A docking device comprises at least one pair of a first docking element 1 and a second docking element 2 (FIG. 1). The first docking element 1 is preferably a movable docking element linked to a mobile unit, and the second docking element 2 is preferably a fixed docking element linked to an equipment. In the application described herein, the first docking element 1 is associated with a transport or handling unit for transporting interface units from one part of the equipment to another, and the second docking element 2 is associated with a part of an equipment for testing interface units, such as a storage device or a test device. Preferably, two such pairs of docking elements 1, 2 are provided. The first docking element 1 is also referred to as the centering unit 1, and the second docking element 2 is also referred to as the alignment unit 2. The alignment unit 2 can align and centrally receive the centering unit 1 during the docking process of the docking device.

In one embodiment, the centering unit 1 has a housing 3 and a centering pin 4. The centering pin 4 has a circumferential groove 5. The housing 3 may taper towards the centering pin 4 in the form of a chamfer 6. In particular, the housing 3 may have a cylindrical outer surface and the bevel 6 may have a tapered surface. An end position sensor 7 may be arranged inside the housing 3, which may be triggered by a trigger element 8. The end position sensor 7 may comprise a Hall element, and the trigger element 8 may comprise a magnetic element such as a permanent magnet. The end position sensor 7 is configured to detect a docked state of the centering unit 1 on the alignment unit 2.

Figure 4:
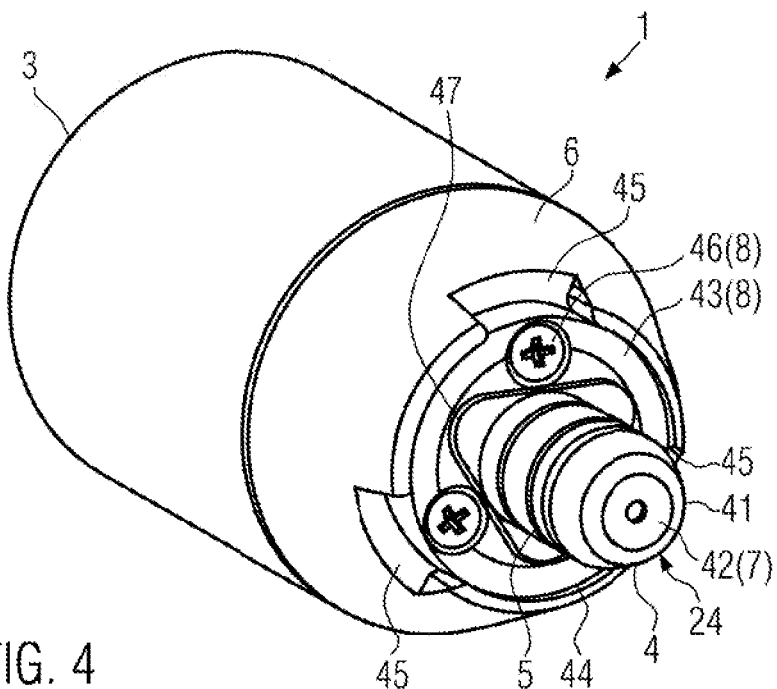
Figure 5:
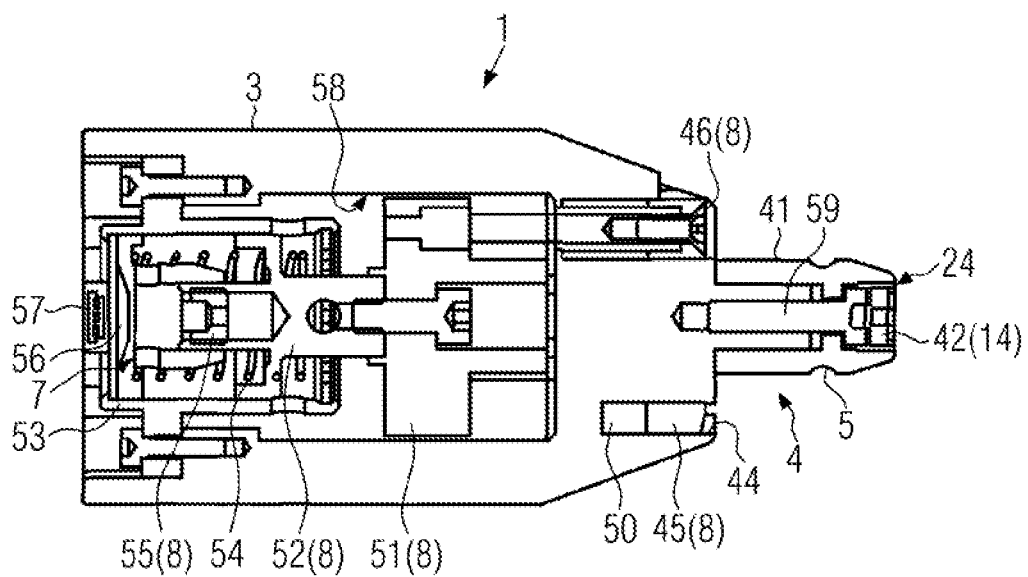

In one embodiment, the centering pin 4 may comprise a sleeve 41 manufactured separately from the housing 3 and arranged in the front area of the centering unit 1 (cf. FIG. 4). The sleeve 41 may have the circumferential groove 5 and may be seated on a saddle 59 which is part of the housing 3 (FIG. 5) or alternatively may be attachable to the housing 3. The sleeve 41 may be exchangeable. This allows a housing 3 to be equipped with several forms of centering pins 4 that differ, for example, in length and/or diameter of the sleeve 41 itself and/or in position, width and/or depth of the circumferential groove 5 in order to adapt them to different alignment units 2. If the sleeve 41 is formed from a particularly resistant, in particular hard, material in relation to the housing 3, it can withstand mechanical stresses in the region of the circumferential groove 5 particularly well and the housing 3 can be made from a less resistant and possibly less expensive material. If the sleeve 41 is formed from a less resistant material in relation to the housing 3, it can be designed as a wear part, which can also be advantageous in operation.

The alignment unit 2 has a housing 9 which is designed to accommodate the centering unit 1. A locking unit 10 may be provided on the housing 9 for locking the first docking element 1 to the alignment unit 2. The locking unit 10 may comprise a gripper 11 and an actuating member 12. The gripper 11 may be configured to grip the centering pin 4 of the centering unit 1 at its circumferential groove 5 and to lock it by means of the actuating member 12. The gripper 11 may be formed, for example, by a ball clamping sleeve which in a first position receives the centering pin in an axially movable manner and in a second position is pressed into the circumferential groove 5. The actuating member 12 may have a cylinder, so that the ball clamping sleeve, which is surrounded by an annular pressure chamber sealed in a pressure-tight manner with respect to the insertion region of the centering pin 4 and is movable in the axial direction by means of an annular piston, can be actuated by means of a pressure medium introduced into the pressure chamber through the cylinder. Such a locking unit 10 with fluid-actuated ball clamping sleeve is described in U.S. Pat. No. 7,382,145 B2 or DE 10 2005 036 808 A1, the disclosure content of which is referred to in full in this respect. Simpler solutions with spindle-actuated ball clamping sleeves are described in U.S. Pat. No. 6,870,362 B2 and DE 102 16 003 A1, the disclosure content of which is also referred to in full in this respect.

The alignment unit 2 may also have an end position sensor 13 associated with it, which may be triggered by a trigger element 14. The end position sensor 13 may comprise a Hall element, and the trigger element 14 may comprise a permanent magnet. The end position sensor 13 is configured to detect a docked state of the centering unit 1 on the alignment unit 2.

The alignment unit 2 may further have associated therewith a presence sensor or proximity sensor 15, which may be triggered by a trigger element 16. The proximity sensor 15 may be disposed in a pocket 17 of the housing 9. The proximity sensor 15 may comprise a push button, and the trigger element 16 may comprise a mechanical member acting on the push button.

It is to be understood that any one of the equipment side end position sensor 13, the transport side end position sensor 7, and the proximity sensor 15, as well as any combination thereof in the docking device, may be an embodiment of the invention.

A receiving space 18 of the housing 9 of the alignment unit 2 is designed to receive the centering unit 1 and approximately reproduces its shape. A lead-in bevel 19 opens the receiving space 18 to the outside and is designed to guide the housing 3 of the centering unit 1 into the receiving space 18 when it approaches eccentrically. The lead-in bevel 19 may be formed as a conical inlet funnel. For this purpose, the lead-in bevel 19 may have a bevel angle corresponding to the bevel angle of the bevel 6 of the centering unit 1. The receiving space 18 itself may have a wall 20 which corresponds approximately to an outer contour of the housing 3 of the centering unit 1 and, in particular, may be cylindrical. The lead-in bevel 19 merges into the wall 20 via a transition edge 25. The wall 20 may recede radially outwardly behind the transition edge. The transition edge 25 and/or the wall 20 may serve to axially guide the centering unit 1 once it is captured by the lead-in bevel 19. The receiving space 18 can also have an abutment surface 21 with a bevel that corresponds approximately to the bevel 6 of the centering unit 1 and, in particular, can form a conical seat. The locking unit 10, the aligning unit 2 and the centering unit 1 are dimensioned relative to one another such that the locking unit 10 has reached its (final) locking position when the bevel 6 of the centering unit 1 rests firmly against the abutment surface 21.

Figure 2:
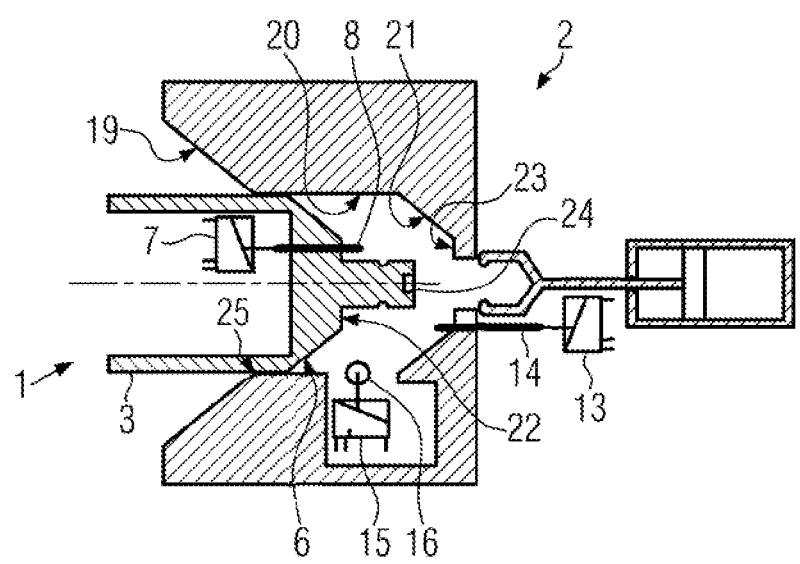

The trigger element 14 of the end position sensor 13 of the alignment unit 2 can have a sensing device which protrudes into the receiving space 18 and can interact with a contact surface 22 of the centering unit 1 (FIG. 2). A magnet may be attached to the end of the sensing device, or the sensing device itself may be magnetic to trigger a Hall element of the end position sensor 13. This is a basic embodiment illustrating the operation of the end position sensor 13. The specific embodiment of the end position sensor 13 and its trigger element 14 may differ. For example, in one embodiment, the end position sensor 13 may comprise a Hall element arranged on the axis of the locking element 10, and the trigger element 14 may also be a magnetic element 42 arranged on the tip 24 of the centering pin 4 of the second docking element (cf. FIG. 4). In other words, the trigger element 14 of the end position sensor 13 of the alignment unit 2 may also be arranged on the centering unit 1. The magnetic element 42 may be positionable in the centering pin 4, for example by means of a thread, preferably with a self-locking function. As a result, the position of the magnetic element 42 and thus the response depth of the end position sensor 13 can be finely adjusted.

The trigger element 8 of the end position sensor 7 of the centering unit 1 may have a sensing device which protrudes from the housing 3 of the centering unit 1 and is pressed by a contact surface 23 of the housing 9 of the alignment unit 2 (FIG. 2). A magnetic element may be attached to the end of the sensing device, or the sensing device itself may be magnetic to trigger a Hall element of the end position sensor 7. This is a basic embodiment illustrating the operation of the end position sensor 7. The specific embodiment of the end position sensor 7 and its trigger element 8 may differ. In a particular embodiment, the trigger element 8 may have a contact ring 43 movably mounted in the housing 3 (cf. FIG. 4), which may interact with one or more protrusions (not shown in more detail) on the side of the alignment unit 2 protruding into the interior of the receiving space 18 and having the contact surface 23. The contact ring 43 may be surrounded by an annular wall 44 of the housing 3, whereby the contact ring 43 may also be protected against accidental contact. The annular wall 44 may include recesses 45 corresponding in shape and location to protrusions within the receiving space 18, and release the contact ring 43 for actuation by those protrusions, while the contact ring 43 may be protected against inadvertent contact in the remaining portions of the annular wall 44. The contact ring 43 may be received in an annular space 50 (FIG. 5) bounded radially outwardly by the annular wall 44 and radially inwardly by a prismatic contour surface 47. The contour surface 47 may have a non-circular, in particular multi-toothed, for example substantially triangular, cross-section to prevent circumferential movement (twisting) of the contact ring 43. The contact ring 43 may be connected by connecting means 46 to a post 52, which is mounted in a cage 53 by means of springs 54 and carries a magnetic element 55 at its end. An intermediate element 51 may be provided to facilitate assembly and improve force transmission from the contact ring 43 to the post 52. A Hall element 56 may be arranged at the bottom of the cage 53, which may output a signal via a connection unit 57 when the magnetic element 55 approaches. The magnet element 55 and/or the Hall element 56 may be positionable, for example by means of a thread, preferably with a self-locking function. This allows the relative position of the magnetic element 56 and the Hall element 59, and thus the response depth of the end position sensor 7, to be finely adjustable. The cage 53 can be arranged in a cavity 58 of the housing 3, which is axially opposite the annular space 50 for receiving the contact ring 46.

Even though the end position sensors 7 and 13 have been described as Hall sensors in the embodiments, the invention is not limited to this. Rather, any type of sensor, for example mechanical such as in the form of a pushbutton, strain gauge or the like, optical such as in the form of a photoelectric sensor, possibly laser photoelectric sensor or infrared photoelectric sensor can be used depending on the requirements.

The proximity sensor 15 described as a pushbutton can also in principle be designed in any other way mechanical, magnetic or optical.

Figure 3:
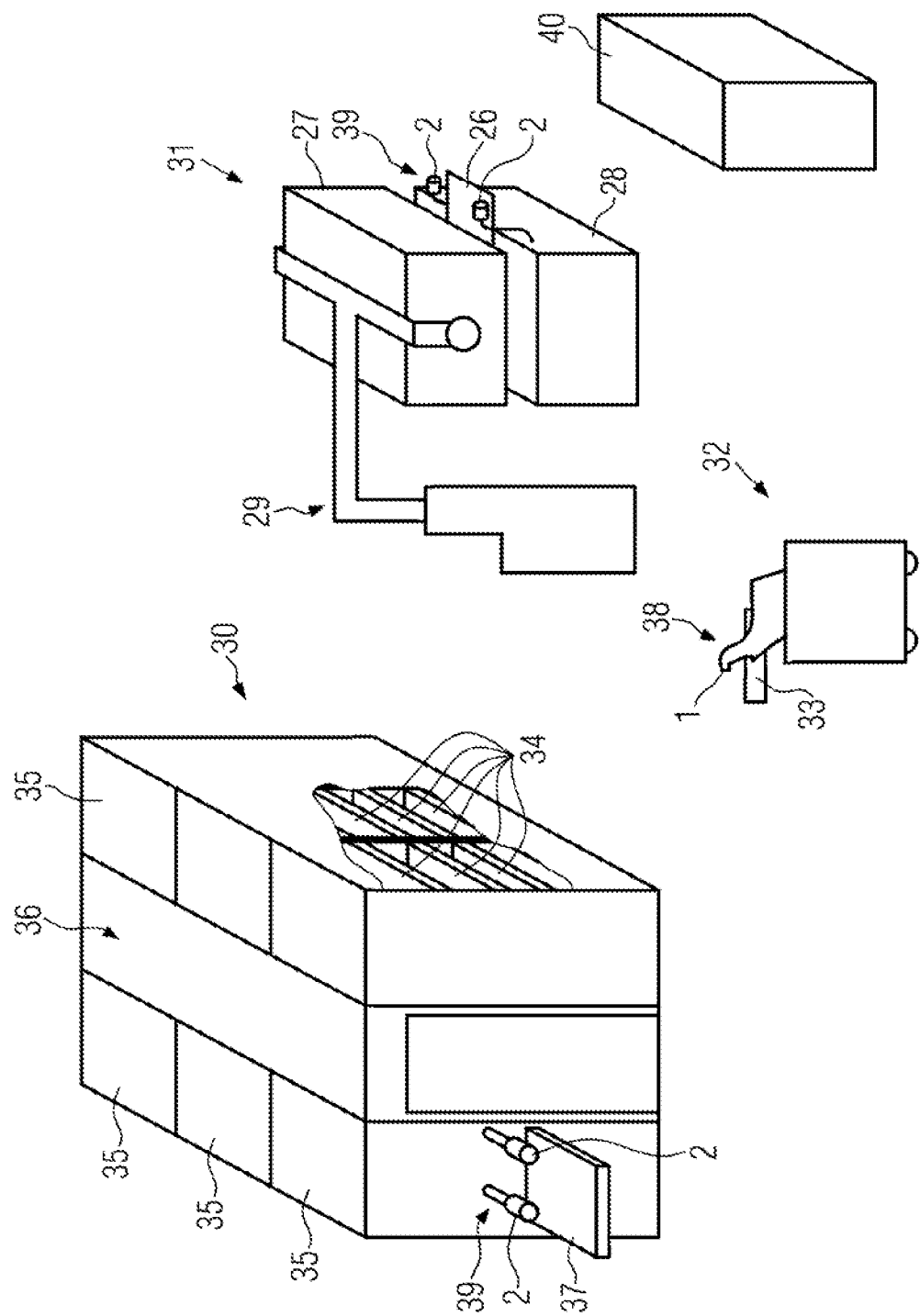

A disposition system that can make use of the docking device described above comprises a storage device 30, a test device 31, and at least one transport or handling unit 32 (FIG. 3). The storage device 30 is used to store a plurality of interface units 33. An interface unit 33 generally comprises an adapter plate and a stiffening frame (not shown in detail). The adapter plate is also referred to as a load board or a device interface board (DIB). A plurality of interface units 33 may be arranged in the storage device on individual carriers (not shown in detail), which in turn may be stored in a rack system and may be movable by a rail and/or elevator and/or manipulator system or the like, so that the interface units 33 together with the carriers may be reliably and safely handled and moved without being damaged in the process. However, other handling mechanisms for the interface units 33 with or without carriers within the storage device are also conceivable. It is understood that the disposition system may comprise a plurality of storage devices 30, a plurality of test devices 31 and, in particular, a plurality of transport or handling units 32, although, for simplicity, only one of each of these elements is shown and described in the embodiment discussed herein.

The storage device 30 may, for example, be designed as a type of micro high rack storage system with many compartments 34 for accommodating one carrier, respectively, together with an interface unit 33. A patent application for such a storage device with carriers in such a disposition system was filed by the applicant of the present application with the post-published application No. DE 10 2020 104 641.3. The embodiment of the storage device 30 shown in the figure has two rows of three columnar storage cabinet elements 35 each, which are arranged with their open front sides facing each other. A corridor 36 is formed between the front sides of the two rows of storage cabinet elements 35. At its front side, the corridor 36 of the storage device 30 is closable by a pivotable door. At its rear side, the corridor 36 is closed off by a wall extending between the two rows.

A horizontal transfer platform 37 may be attached to one of the storage cabinet elements 35. The transfer platform 37 may in turn include a receiving device for an interface unit 33. The receiving device may, for example, have two slide rails for receiving a carrier. The transfer platform 37 may be in the form of a drawer so that it can be pushed or pulled into the interior of the corresponding storage cabinet element 35, where it occupies the position of one of the compartments 34. If the transfer platform 37 is located within the storage cabinet element 35, then, for example, a loading platform (not shown) may be aligned with the transfer platform 37 such that a carrier is interchanged between the transfer platform 37 and the loading platform. The exchange of a carrier between the transfer platform and the loading platform can preferably be performed in the same manner as the insertion and extraction of a carrier from one of the compartments 34 is performed, such as by sliding it along suitable rails. For unambiguous identification of the carriers, the carriers may be provided with a type of bar code comprising, for example, light and dark stripes having a thickness of at least one millimeter, preferably several millimeters. Since the number of carriers is limited, it is sufficient if a binary number with no more than twelve digits is encoded in the barcode. For many applications, even a barcode with which only a binary number with ten digits is encoded may be sufficient. A barcode represented with such wide lines can be reliably recognized from a great distance.

It is often sufficient to use, for example, a camera with a simple lens without adjustment, which is mounted inside the storage device 30, for example on a crossbar, to scan the barcode. Even without adjustment of the lens, the barcode can be recognized on the respective carriers, even if the carrier is located at the very bottom or at the very top in the area of the storage device 30.

The test device 31 may include a test head 27 and a feeding device 28. In the embodiment shown, the test head 27 is arranged on the feeding device 28 so that a horizontal interface surface is formed between the test head 27 and the feeding device 28. Different arrangements of the test head 27 and the feeding device 28 are known, such as with a vertical interface surface, which can be used equally. In the present embodiment, a manipulator 29 is provided to lift the test head 27 off the feeding device 28 a bit when the interface unit 33 is to be replaced. For this purpose, a drawer mechanism 26 may be provided on the test device, such as is shown, for example, in WO 2013/164407 A1 or DE 10 2019 119 134 A1. The drawer mechanism 26 is preferably designed to be fully automatic, so that it independently detaches the interface unit from the test head 27 or from the feeding device 28, removes it and moves it out a little to the side like a drawer.

The handling unit 32 is used for handling and transporting interface units 33 between the storage device 30 and the test device 31. Such a handling unit 32 is known, for example, from WO 2015/025024 A2. The handling unit 32 may be designed as a self-propelled vehicle. The disposition system may also comprise a guiding device (not shown in detail) to guide the handling unit 32 in space or on an equipment floor. The handling unit 32 includes a first docking unit 38. The first docking unit 38 comprises two first docking elements or centering units 1 as described above.

A second docking unit 39 is provided at the transfer platform 37 of the storage device 30, or adjacent to the transfer platform 37 at the storage cabinet element 35, for coupling a handling unit 32 in a positionally accurate manner. The second docking unit 39 has two respective second docking elements or alignment units 2 as described above.

The handling unit 32 can be coupled to the transfer platform 37 in a precise position by means of the docking units 38, 39. This allows an interface unit 33 to be placed on or removed from a carrier located in the area of the transfer platform 37. Due to the docking units 38, 39, the position of the handling unit 32 is clearly defined with respect to the transfer platform 37 and thus with respect to the storage device 30. Thus, the exchange of an interface unit between the handling unit 32 and the storage device 30 can be performed reliably and without damage. In order to pick up an interface unit 33, it may only be necessary to present a carrier at the transfer platform 37 which is not yet occupied by an interface unit 33. After the interface unit 33 has been placed on the free carrier, the carrier with the interface unit 33 can be pulled onto the loading platform and brought with it to one of the compartments 34 to be stored therein.

The docking elements 1, 2 of the docking units 38, 39 are precisely coordinated in their position. In particular, the alignment units 2 of the second docking unit 39 are arranged on a horizontal plane with a defined axial distance from each other, and the centering units 1 of the first docking unit 38 are arranged on the handling unit 32 with the same axial distance. Since the centering units 1 align with the alignment units 2 during docking, the position of the handling unit 32 relative to the storage device 30 is precisely fixed after docking. In particular, by capturing the centering units 1 at the respective lead-in bevel 19 of the alignment units 2, guiding the respective outer surface of the housing 3 of the centering units 1 to the walls 20 or transition edges 25 of the alignment units 2, the defined locking of the respective circumferential groove 5 by the gripper 11 of the locking unit 10, if necessary with the conical surface 6 of the centering units 1 bearing against the conical seat 21 of the alignment units 2, ensures that the handling unit 32 can be forced into a defined position relative to the storage device 30. This also makes it possible, for example, to compensate for unevenness of a plant floor on which the handling unit 32 moves. Alignment movements can thereby be compensated, if necessary, by a wheel suspension of the handling unit 32. Alternatively, a handling unit of the handling unit 32 can be mounted movably relative to a mobile base frame to a sufficient extent to be able to compensate for alignment movements.

The docking elements 1, 2 can be automatically connected and disconnected. This makes it possible for the handling unit 32 to be designed as a self-propelled vehicle and to drive to the storage device 30 in order to automatically couple to the storage device 30 there by means of the docking units 38, 39. The transfer of an interface unit 33 between the handling unit 32 and transfer platform 37 of the storage device 30 is fully automatic. The depositing of the carriers with the interface units 33 in the compartments 34 or the retrieval of the carriers with the interface units again is also fully automatic. This can be controlled by a central control device 40, so that an interface unit 33 to be exchanged is brought fully automatically from the test device 31 to the storage device 30, exchanged there with another interface unit 33, and the exchanged interface unit 33 is conveyed to the test device 31 by the handling unit 32. In this way, errors in operation are eliminated, the interface units 33 can be reliably conveyed between the storage device 30 and the test device(s) 31 without damage, and moreover, a plurality of interface units 33 can be stored in a confined space in the storage device 30.

A second docking unit 39 with second docking elements or alignment units 2 is also arranged on the test device 31, in particular the stationary part standing on the ground, which in the present embodiment is the feeding device 28, in order to precisely position the handling unit 32 with respect to that of the test device 31, so that a reliable and automatic transfer of the interface unit between the drawer mechanism 26 of the test device 31 and the handling unit 32 is possible. In practice, it may also be envisaged that the manipulator undocks the test head 27 only when the proximity sensor 15 is triggered, and then the handling unit 32 introduces the interface unit 33 into the feed device (handler, prober) from above.

After replacing an interface unit 33 on the test device 31, the test head 27 and the feeding device 28 are automatically moved together by means of the manipulator 29 and the test operation can be resumed. In other embodiments, the test device 31 may also be designed such that it is not necessary to move the test head 27 and the feeding device 28 apart in order to eject or insert the interface unit, for example, using a drawer mechanism 26. The test device 31 may also be provided with an internal lifting device for moving the test head 27 and the feeding device 28 apart in order to eject or insert the interface unit, for example, with a drawer mechanism 26. With these two test devices 31, it is not necessary to use a manipulator to exchange the interface units fully automatically (controlled by the central control device 40) at the test device 31 and to transfer them back and forth between the test device 31 and the storage device 30.

The central control device 40 can have a signal or data connection via a communication device to the storage device 30, to the handling unit 32, to the test device 31 and to the manipulator 29, which also comprise respective communication devices. The data link may be a radio link and/or may be cable-guided. Within the scope of the invention, the disposition system shown may also be designed to be only partially automatic, in which case, for example, the manipulator 29 and/or the handling unit 32 and/or the drawer mechanism 26 are designed to be non-automatically operable. The intelligence of the central control device 40 may also be partially or completely distributed among modules arranged on the storage device 30, the handling unit 32, the test device 31 and the manipulator 29. Also, in this case, a data link may be provided between the modules on the individual devices 30, 32, 31 for exchanging the signals of the sensor devices 7, 11, 13 by respective communication devices. A data exchange between the handling unit 32 on the one hand and the storage device 30 or the test device 31 on the other hand can also be provided wirelessly via generally known means, interfaces, and standards, a direct connection can also be provided via plug-in connections which are connected to each other when the docking elements 1, 2 are coupled.

A first docking unit 38 with one or more, preferably two first docking elements or centering units 1 and a second docking unit 39 with one or more, preferably two second docking elements or alignment units 2 form a docking device in the sense of the invention. The second docking unit 39 also has the locking units 10 described above, each of which is associated with an alignment unit 2. The alignment units 2 with locking units 10 are associated with the equipment side, they are therefore to be understood as fixed. The centering units 1 with locking pins 4, which can interact with the locking units 10, are assigned to a handling or transport side, they are therefore to be understood as mobile. Of course, the roles can also be reversed, and alignment units 2 with locking units 10 can be provided on the mobile side, while centering units 1 with the locking pins 4 are provided on the fixed side. In another variant, it is conceivable that an alignment unit 2 with locking unit 10 and a centering unit 1 with locking pin 4 are provided on each side. Furthermore, it is also conceivable that a handling unit 32 has a second docking unit 39 at a first end and a first docking unit 38 at a second end, in this way it is also possible to form handling or transport lines in which a plurality of handling units 32 are coupled together. It is to be understood that a docking system is formed by the first docking units 38 and second docking units 39, wherein with each coupling operation of a handling unit 32 to another equipment part, a docking device is formed from exactly one first docking unit 38 and one second docking unit 39. In other words, each first docking unit 38 may form a docking device with each second docking unit 39 of the same docking system.

A docking operation using such a docking device will now be described for coupling a handling unit 32 as an example of a mobile part to a storage device 30 as an example of an equipment part.

First, the handling unit 32 and the storage device 30 are not connected to each other or to other objects (FIG. 3). The alignment unit 2 and the centering unit 1 are remote from each other (FIG. 1). When a handling unit 32 is to couple to the storage device 30, it is first roughly positioned with respect to the storage device 30. For this purpose, a global (global in the sense of the entire system) guidance system such as a magnetic rail system, a laser guidance system, a radio guidance system or the like can be used. The movement of multiple handling units 32 can also be controlled by this guidance system in such a way that collisions are avoided and running times, paths and transfer times are optimized. The guidance system can be controlled by the central control unit 40. This pre-positioning is accurate enough that the centering units 1 can be captured by the alignment units 2.

The handling unit 32 now moves towards the storage device 30 so that the centering unit 1 is caught by the lead-in bevel 19 of the alignment unit 2. Whenever the centering unit 1 or the alignment unit 2 is referred to here and in the following, this always means each centering unit 1 of the second docking unit 39 or each alignment unit 2 of the first docking unit 38 of the docking device, unless explicitly described otherwise.

When the centering unit 1 has been caught by the lead-in bevel 19, the housing 3 of the centering unit 1 is first guided along the wall 20 further into the receiving space 18. This corresponds to a pre-centered state (FIG. 2). The wall 20 can serve as a guide surface for the housing 3 of the centering unit 1 and also absorb momentum perpendicular to the axis. This can be advantageous if only one pair of docking elements 1, 2 is provided for the coupling. If the wall 20 recedes outwardly behind the transition edge 25 between the lead-in bevel 19 and the wall 20, the guide surface to the guide edge can be reduced or the transition edge 25 can serve as a guide edge, which can also avoid overdetermination of the positioning. This can be particularly significant when multiple pairs of docking elements 1, 2 are provided for docking. Initially, the trigger element 16 of the proximity sensor 15 still protrudes into the receiving space 18 from the pocket 17. When the bevel 6 hits the trigger 16 of the proximity sensor 15, this trigger 16 is displaced by the bevel 6 and eventually triggers the proximity sensor 15. The proximity sensor 15 then outputs a pre-centering signal corresponding to the detection of the pre-centered condition (approach position). A control device receives the pre-centering signal and outputs a pre-latching signal to the locking unit 10, which then switches to a pre-latching state. This pre-latching state is characterized by the gripper 11 being placed in a first position for receiving the centering pin 4 such that it is axially movable between gripping elements of the gripper 11. At the same time, the actuator 12 may be placed in a ready state and/or the operability of the locking unit 10 may be confirmed. Optionally, the first position of the gripper 11 can be preset passively, for example by spring mounting on both sides in a zero position, otherwise the first position can be actively approached by the actuating member 12.

Once the pre-engagement state is confirmed or, if multiple pairs of docking elements 1, 2 are provided, once the pre-engagement state is confirmed in all pairs of the docking device, the controller can initiate the docking operation. In other words, a docking signal is output to the locking unit 10 or all the locking units 10 of the docking device, causing them to activate the actuating member 12 to actuate the gripper 11. The triggering of the docking signal may depend on other preconditions such as the completion of certain operations on the equipment side, such as the provision of a drawer mechanism 26, a feeding device 28 or transfer platform 37, the completion of a test cycle, the intermediate positioning of an interface unit 33 so that the equipment side (first fixture) is free to receive a new interface unit 33, etc. In response to the docking signal, the gripper 11 can grip and lock the annular groove 5 of the centering pin 4. This pulls the centering unit 1 completely into the receiving space 18 of the alignment unit 2. In the process, the bevel 6 of the centering unit 1 can come into contact with the abutment surface 21 in the receiving space 18. Now the locking state of the locking unit 10 is reached. The end position sensor 13 of the alignment unit 2 registers this locking state and outputs a first locking state signal to the control unit.

It is understood that the exact procedure depends on the specific structure of the locking unit 10. The locking unit 10 is only intended to be suitable and designed to move the first docking element 1 relative to the second docking element 2 and to fix it in an end position. To realize this function, the gripper 11 with actuating member 12 described herein may be used in any suitable embodiment. Also, the described centering pin 4 with annular groove 5 is only an illustrative, but not limiting example. The locking unit 10 can be designed and controlled in such a way that reaching the end position can be achieved exclusively actively via the locking unit 10, i.e. gripping by the gripper 11 or the like and pulling by the actuating member 12. In this way, automatic approach of the end position by the second device, uncontrolled triggering of the end position sensor 11 and/or 7 and unintentional initiation of operations on the side of the first or the second device can be avoided. On the other hand, the control system can also be designed to be robust enough so that reaching the end position can be processed without problems regardless of whether the movement is triggered by the locking unit 10 or the second (movable) device.

Once the locking state is confirmed by the end position sensor 13 of the alignment unit 2 (or, if multiple pairs of docking elements 1, 2 are provided, once the locking state in all pairs of the docking device is confirmed by the end position sensor 13 of the respective alignment unit 2), the control can determine the docking state. Once the docking state is determined on the alignment unit 2 side, further operations on the docking side requiring a proper docking state can be enabled.

Also, the end position sensor 7 of the centering unit 1 can register the locking state and output a second locking state signal. Once the locking state is confirmed by the end position sensor 7 of the second docking element 2 or, if multiple pairs of docking elements 1, 2 are provided, once the locking state in all pairs of the docking device is confirmed by the end position sensor 7 of the respective second docking element 2, a control can determine the docking state. Once the docking state is determined, further operations requiring a proper docking state can be enabled, in particular the transfer of the transported interface unit 33.

In the manner described above, the determination of the docking state on the side of the alignment unit 2, which is assigned to a fixed or equipment side, for example, and the determination of the docking state on the side of the centering unit 1, which is assigned to a mobile or transport side, for example, can be carried out separately and independently of each other. Procedures on a transport unit can thus be released and carried out autonomously and independently of the equipment side, for example, and vice versa. The entire disposition system, in particular the transport units 32, can thus also be controlled largely independently of a central controller or control system. Communication between the equipment side and the transport side is also not absolutely necessary. For example, a wireless signal transmission system, such as WLAN, NFC or mobile radio, can be dispensed with. This can be particularly significant in environments that are sensitive with regard to electronic signals. At the same time, manual locking and unlocking of the transport units is not necessary.

It should be noted that the sensing of both the approach and the end position on both sides is an advantageous embodiment, but already a single or a combination of these sensing processes can already exhibit individual advantages described. It is therefore also possible to dispense with individual sensing operations in certain applications. Each of the individual sensing processes represents an embodiment of the invention.

Each storage device 30, test device 31, and handling unit 32 of the disposition system may have a unique identifier that may be encoded in a sensor signal transmitted from each sensor device 7, 13, 15 and in each control signal transmitted from the control device 40. In addition to the possibility of controlling operations of a handling unit 32 in response to a sensor signal of the first sensor unit(s) 7 in a fully or partially autonomous or self-sufficient manner independently of the control of the equipment side, there is also the possibility of centrally receiving and processing the sensor signals of the first sensor unit(s) 7 with coded identifier and thus centrally controlling operations of a handling unit 32 in response to a sensor signal of the corresponding first sensor unit(s) 7.

For the management of interface units 33, these can be provided with optical or other identification features, such as RFID tag, color code, 3D code or bar code or other machine-readable feature. This identification feature can be read on the side of the storage device, the test device and/or the transport unit by suitable sensor devices (RFID receiver, code scanner, camera, etc.). Therefore, the system or the individual device can know where which of the interface units 33 is located, whether a transport unit 32 is occupied or not, whether a transfer platform 37 of the storage device 30 or a drawer device 26 of the test device 26 is occupied or not, and if so, by which of the interface units 33. In this way, for example, double occupancies or other errors can be avoided.

Furthermore, if communication devices are provided on the transport unit 32, the storage device 30, and the test device 31 that can communicate with each other or with the central control device 40, integrated sequence control with any degree of automation, self-sufficiency, and centralization can be implemented. For example, if the transport unit 32 knows which interface unit 33 it carries or requires and where to transport it, which may be determined, for example, by a previously stored or immediately transmitted program, the transport unit 32 can find its way automatically. The communication may use any suitable means, method, or standardization scheme, and may be unidirectional or bidirectional in design.

It is understood that the invention is defined by the claims in their breadth scope. The description of the embodiments serves solely to illustrate the invention and not to limit the scope of protection of the patent claims.

LIST OF REFERENCE SIGNS

1 First docking element (Alignment unit)
2 Second docking element (centering unit)
3 Housing
4 Locking pin
5 Circumferential groove
6 Bevel (cone surface)
7 Second sensor device (end position sensor)
8 Trigger element
9 Housing
10 Locking unit
11 Gripper
12 Actuating member (cylinder)
13 First sensor device (end position sensor)
14 Trigger element
15 Third sensor device (proximity sensor)
16 Trigger
17 Pocket
18 Receiving space
19 Lead-in bevel
20 Wall
21 Seat surface (conical seat)
22 Abutment surface
23 Abutment surface
24 Tip
25 Transition edge
26 Drawer mechanism
27 Test head
28 Feeding device
29 Manipulator
30 Storage device
31 Test device
32 Handling unit
33 Interface unit
34 Compartment
35 Storage cabinet element
36 Corridor
37 Transfer platform
38 Docking unit
39 Docking unit
40 Control device
41 Sleeve
42 Magnetic element
43 Contact ring (actuator)
44 Annular wall
45 Recess
46 Connecting element
47 Contour surface
50 Annular room
51 Piston
52 Post
53 Cage
54 Spring
55 Magnetic element
56 Hall element
57 Connection unit
58 Cavity
59 Saddle

The invention claimed is:

1. A storage device for storing interface units for testing electronic components in test devices, wherein the storage device is a first device and comprises:
a plurality of compartments, each for accommodating one interface unit;
a handling mechanism for moving interface units between the compartments of the storage device;
a transfer platform for transferring an interface unit between an outer area of the storage device and the handling mechanism in an inner area of the storage device; and
at least one first docking element or second docking element proximate the transfer platform, wherein the other docking element is attached to a handling unit for handling and/or transporting interface units, wherein the first docking element is movable relative to the second docking element and can be fixed in an end position, and wherein a sensor arrangement is provided which is adapted and arranged to detect the end position of the first docking element relative to the second docking element on the side of the first device and/or on the side of the second device.

2. The storage device according to claim 1, wherein the sensor arrangement comprises a first sensor device which is adapted and arranged to detect the end position of the first docking element relative to the second docking element on the side of the storage device.

3. The storage device according to claim 2, wherein the first sensor device comprises a sensor element, in particular Hall element, which is arranged on the second docking element, and a trigger element, in particular magnet element, which is arranged on the first docking element or is arranged on the second docking element in such a way that it can be actuated by contact with the first docking element, the sensor element being designed to interact with the trigger element in order to detect the end position of the first docking element with respect to the second docking element.

4. The storage device according to claim 2, wherein the first sensor device is designed to signal a detection of the end position to an electronic control unit and/or to the handling unit.

5. Docking device for coupling a first device consisting of a test device or a storage device for interface units for testing electronic components with at least one second device consisting of a handling unit for handling and/or transporting interface units, which is adapted to exchange an interface unit with the first device in a coupled state, wherein the docking device comprises a first docking element, which is attached to the first device or the second device, and a second docking element which is attached to the other of the first device and the second device, wherein the first docking element is movable relative to the second docking element and can be fixed in an end position, wherein a sensor arrangement is provided which is adapted and arranged to detect the end position of the first docking element relative to the second docking element on the side of the first device and/or on the side of the second device, and wherein the sensor arrangement comprises a second sensor device which is adapted and arranged to detect the end position of the first docking element relative to the second docking element on the side of the second device.

6. Docking device according to claim 5, wherein the second sensor device comprises a sensor element, in particular Hall element, which is arranged on the first docking element, and a trigger element, in particular magnet element, which is arranged on the first docking element and can be actuated by contact with the second docking element, the sensor element being designed to interact with the trigger element in order to detect the end position of the first docking element relative to the second docking element.

7. Docking device according to claim 6, wherein the trigger element of the second sensor device comprises an annular actuating member, which is axially displaceably and resettably mounted on the first docking element, so as to be movable relative to the sensor element of the second sensor device, which is fixedly mounted on the first docking element.

8. Docking device according to claim 5, wherein the second sensor device is designed to signal a detection of the end position to an electronic control unit and/or to the storage device.

9. The storage device according to claim 1, wherein the first docking element comprises a locking pin and the second docking element comprises a locking unit, wherein the locking unit comprises an axial insertion opening for inserting the locking pin and a holding mechanism for holding the locking pin in the end position of the first docking element relative to the second docking element to fix the first docking element relative to the second docking element in the end position.

10. The storage device according to claim 9, wherein the locking pin or a housing of the first docking element comprises an abutment surface and the locking unit or a housing of the second docking element comprises a counter surface corresponding to the abutment surface, wherein a contact of the abutment surface with the counter surface defines the end position of the first docking element relative to the second docking element, wherein preferably the abutment surface and the counter surface are circumferential conical surfaces.

11. The storage device according to claim 9, wherein the locking unit is adapted for a plurality of balls formed in the region of the insertion opening, between which the locking pin can be inserted, and a ball clamping sleeve which can be displaced in the axial direction and which, in a first position, allows the balls to be positioned radially outside the insertion region of the locking pin in which the locking pin can be inserted between the balls, and in a second position locks the balls in a locking position in which the balls protrude into a circumferential groove of the inserted locking pin, the position of the ball clamping sleeve preferably being actuated by a pressure means, in particular pneumatically or hydraulically.

12. The storage device according to claim 3, wherein the trigger element of the first sensor device is a magnetic element which is arranged on or within a tip of a locking pin of the first docking element and is preferably adjustable in its distance from an end cross section of the tip of the locking pin, in particular by screwing in or out by means of a screw thread.

13. Docking device for coupling a first device consisting of a test device or a storage device for interface units for testing electronic components with at least one second device consisting of a handling unit for handling and/or transporting interface units, which is adapted to exchange an interface unit with the first device in a coupled state, wherein the docking device comprises a first docking element, which is attached to the first device or the second device, and a second docking element which is attached to the other of the first device and the second device, wherein the first docking element is movable relative to the second docking element and can be fixed in an end position, and wherein a sensor arrangement is provided which is adapted and arranged to detect the end position of the first docking element relative to the second docking element on the side of the first device and/or on the side of the second device, wherein the first docking element comprises a locking pin and the second docking element comprises a locking unit, wherein the locking unit comprises an axial insertion opening for inserting the locking pin and a holding mechanism for holding the locking pin in the end position of the first docking element relative to the second docking element to fix the first docking element relative to the second docking element in the end position; and wherein the annular actuating member is arranged in an annular space surrounding the locking pin and is set back from a tip of the locking pin.

14. The storage device according to claim 1, wherein the second docking element comprises axis aligning means for aligning an axis of the first docking element with respect to an axis of the second docking element, the aligning means comprising at least one of a lead-in bevel for axial and radial capturing, a guide surface or guide edge for axial guiding, and a conical seat surface for centering in the end position.

15. Docking device for coupling a first device consisting of a test device or a storage device for interface units for testing electronic components to at least one second device consisting of a handling unit for handling and/or transporting interface units, which is designed to exchange an interface unit with the first device in a coupled state, wherein the docking device comprises a first docking element, the first docking element being attached to one of the first device and the second device, and a second docking element being attached to the other of the first device and the second device, wherein the first docking element is movable relative to the second docking element and fixable in an end position, wherein a third sensor device is provided, which is adapted and arranged to detect an approach position of the first docking element relative to the second docking element before the end position, preferably on the side of the first device, and wherein the third sensor device is designed to indicate a detection of the approach position to an electronic control unit and/or to the second device.

16. Docking device according to claim 15, wherein the approach position is a position in which an axis of the first docking element is aligned or pre-aligned relative to an axis of the second docking element, and/or is a position in which a locking unit can grip a locking element, in particular a locking pin, of the first docking element in order to fix the first docking element with respect to the second docking element in the end position.

17. Docking device for coupling a first device consisting of a test device or a storage device for interface units for testing electronic components to at least one second device consisting of a handling unit for handling and/or transporting interface units, which is designed to exchange an interface unit with the first device in a coupled state, wherein the docking device comprises a first docking element, the first docking element being attached to one of the first device and the second device, and a second docking element being attached to the other of the first device and the second device;

wherein the first docking element is movable relative to the second docking element and fixable in an end position, wherein a third sensor device is provided, which is adapted and arranged to detect an approach position of the first docking element relative to the second docking element before the end position, preferably on the side of the first device, and wherein the docking device comprises a first docking unit and a second docking unit, wherein the first docking unit comprises two or more first docking elements and the second docking unit comprises two or more second docking elements or wherein the first docking unit and the second docking unit each comprise at least one first docking element and at least one second docking element.

18. Method for coupling a storage device for interface units for testing electronic components to at least one handling unit for handling and/or transporting interface units, wherein at least one first docking element or second docking element is attached to the storage device and the other docking element is attached to the handling unit, wherein the storage device and the handling unit are coupled to each other by positioning the first docking element opposite to the second docking element and by fixing it in an end position, wherein the end position of the first docking element opposite to the second docking element on the side of the storage device and/or on the side of the handling unit is sensed.

19. Method according to claim 18, wherein an operation relating to an interface unit on the side of the storage device is not released until the end position of all first docking elements relative to all respective second docking elements on the side of the storage has been detected, and/or an operation relating to an interface unit on the side of the handling unit is not released until the end position of all first docking elements relative to all respective second docking elements on the side of the handling unit has been detected.

20. Method according to claim 18, for coupling a storage device for interface units for testing electronic components to at least one handling unit for handling and/or transporting interface units, wherein a first docking element or a second docking element is attached the storage device and the other docking element is attached to the handling unit, wherein the storage device and the handling unit are coupled to each other by positioning the first docking element opposite to the second docking element and by fixing it in an end position, and wherein an approach position of the first docking element opposite to the second docking element is sensed before the end position on the storage device side and/or on the handling unit side.

21. Method according to claim 20, wherein an operation relating to the fixing of the at least one first docking element with respect to the at least one second docking element is released only when the approach position of all first docking elements with respect to all respective second docking elements has been detected.

22. Method according to claim 18,
wherein
sensor signals on the side of the storage device and/or of the handling unit are processed autonomously or semi-autonomously and operations are executed autonomously or semi-autonomously as a function of sensor signals on the side of the storage device and/or of the handling unit.

23. Disposition system for automatic management of interface units, comprising
at least one first device comprising a storage device for storing a plurality of electronic component interface units and a test device such as a tester or prober for testing the electronic components, and
at least one second device, which is an independently movable handling unit with means for receiving an interface unit,
wherein the second device is couplable to the first device by means of a first docking element and a second docking element, and wherein the storage device comprises:
a plurality of compartments, each for accommodating one interface unit;
a handling mechanism for moving interface units between the compartments of the storage device;
a transfer platform for transferring an interface unit between the outer area of the storage device and the handling mechanism in the inner area of the storage device; and
at least one first docking element or second docking element proximate the transfer platform, wherein the other docking element is attached to a handling unit for handling and/or transporting interface units,
wherein the first docking element is movable relative to the second docking element and can be fixed in an end position, and
wherein a sensor arrangement is provided which is adapted and arranged to detect the end position of the first docking element relative to the second docking element on the side of the storage device or on the handling unit.

24. Disposition system according to claim 23,
wherein
the first devices and/or the second devices are adapted to process sensor signals relating to a sensing of an end position of the first docking element relative to the second docking element and/or an approach position of the first docking element relative to the second docking element autonomously or semi-autonomously and to execute operations autonomously or semi-autonomously depending on such sensor signals.

25. Disposition system according to claim 23,
wherein
a central control device is provided, which is designed to carry out control in such a way that interface units are automatically transported back and forth between a plurality of first devices by means of the second device and are automatically exchanged between the second device and a respective first device, with the control device preferably being adapted to receive and process sensor signals relating to a sensing of an end position of the first docking element with respect to the second docking element and/or an approach position of the first docking element with respect to the second docking element, and to control operations on the side of the first device and/or the second device automatically or semi-automatically depending on such sensor signals.

26. Docking element for coupling a first device consisting of a test device or a storage device for interface units for testing electronic components to at least one second device consisting of a handling unit for handling and/or transporting interface units, which is designed to exchange an interface unit with the first device in a coupled state, by interacting with a second docking element, which is attached to the other of the first device and the second device, the docking element being movable relative to the second docking element and fixable in an end position, the docking element comprising a housing and a locking pin having a circumferential groove which can be coupled to a locking unit of the second docking element, wherein the docking element comprises a sensor device which is adapted and arranged to detect the end position of the first docking element relative to the second docking element, wherein the locking pin comprises a sleeve which is connected to the housing via a saddle and which comprises the circumferential grove.

27. Docking element according to claim 26,
wherein
the sensor device comprises a sensor element, in particular a Hall element, which is arranged on the first docking element, in particular within the housing thereof, and a trigger element, in particular a magnet element, which is arranged on the first docking element such that it is moveably arranged relative to its position with respect to the sensor element.

28. Docking element according to claim 27,
wherein
the trigger element has an annular actuating member which is mounted on the docking element, in particular within the housing thereof, such that it can be displaced axially and can be rotationally fixed and reset, in order to be movable with respect to the sensor element, wherein the annular actuating member being mounted, in particular, within an annular space of the housing which surrounds the locking pin wherein the annular space is preferably radially bounded by an annular wall and a contour surface and is open axially towards the locking pin, wherein an outer wall of the annular space preferably protrudes axially beyond the actuating member and comprises recesses which recede axially behind the actuating member.

29. Docking element for coupling a first device consisting of a test device or a storage device for interface units for testing electronic components to at least one second device consisting of a handling unit for handling and/or transporting interface units, which is designed to exchange an interface unit with the first device in a coupled state, by interacting with a second docking element, which is attached to the other of the first device and the second device, the docking element being movable relative to the second docking element and fixable in an end position, the docking element comprising a housing and a locking pin having a circumferential groove which can be coupled to a locking unit of the second docking element, wherein the docking element comprises a sensor device which is adapted and arranged to detect the end position of the first docking element relative to the second docking element,
wherein the sensor device comprises a sensor element which is arranged on the first docking element, in particular within the housing thereof, and a trigger element, in particular a magnet element, which is arranged on the first docking element such that it is moveably arranged relative to its position with respect to the sensor element, wherein the trigger element can be adjusted in its distance from the sensor element, in particular by screwing in or out by means of a screw thread in a post coupled to an actuating member, in particular the annular actuating member.

30. Docking element according to claim 26, wherein the locking pin carries a trigger element, in particular a magnetic element, which is designed to interact with a sensor device on the side of the second docking element and which is preferably adjustable in its distance from an end cross section of the tip of the locking pin, in particular by screwing in or out by means of a screw thread.

31. Docking element according to claim 26, wherein the housing has a cylindrical or substantially cylindrical main body and a conical or substantially conical bevel towards the locking pin.

32. Docking element according to claim 26, wherein the sensor element is designed to indicate a detection of the end position to an electronic control unit.

* * * * *